United States Patent [19]

Herold et al.

[11] Patent Number: 4,527,131
[45] Date of Patent: Jul. 2, 1985

[54] OSCILLATING CIRCUIT EXHIBITING TOLERANCE TO CRYSTAL IMPEDANCE VARIATIONS

[75] Inventors: Barry W. Herold, Lauderhill; Walter L. Davis, Plantation, both of Fla.

[73] Assignee: Motorola, Inc., Schaumburg, Ill.

[21] Appl. No.: 564,597

[22] Filed: Dec. 22, 1983

[51] Int. Cl.³ .............................................. H03B 5/36
[52] U.S. Cl. .............................. 331/116 FE; 331/158
[58] Field of Search ............ 331/116 FE, 116 R, 158, 331/159; 368/159

[56] References Cited

U.S. PATENT DOCUMENTS

| | | | |
|---|---|---|---|
| 3,959,744 | 5/1976 | O'Connor | 331/116 R |
| 3,979,698 | 9/1976 | Gollinger | 331/116 R |
| 4,048,590 | 9/1977 | Dobberpuhl | 331/116 R |
| 4,091,338 | 5/1978 | Morihisa | 331/116 R |
| 4,321,562 | 3/1982 | Igarashi | 331/116 FE |

Primary Examiner—Siegfried H. Grimm
Attorney, Agent, or Firm—Joseph T. Downey; James W. Gillman; Edward M. Roney

[57] ABSTRACT

An MOS crystal controlled oscillator circuit is provided which includes a pair of MOS transistors coupled together in complementary fashion to form a first non-inverting stage. The output of the first non-inverting stage is coupled to the input of a second non-inverting stage including a MOS transistor exhibiting a source follower configuration or a bipolar transistor exhibiting an emitter follower configuration. The output of the second non-inverting source follower stage is coupled via a feedback element, for example, a piezoelectric crystal, to the input of the first non-inverting stage. A feedback loop is thus formed which causes the circuit to resonate at a frequency determined by the piezoelectric crystal feedback device. This oscillator configuration results in a degree of insensitivity to variations in parasitic impedance of the piezoelectric crystal feedback device. That is, the oscillator remains operative on the desired resonant frequency despite significant variations in the parasitic impedance associated with the piezoelectric crystal element.

4 Claims, 2 Drawing Figures

OSCILLATING CIRCUIT EXHIBITING TOLERANCE TO CRYSTAL IMPEDANCE VARIATIONS

BACKGROUND OF THE INVENTION

This invention relates to oscillator circuits and, more particularly to oscillator circuits which employ piezoelectric elements to control the frequency at which such circuits oscillate.

DESCRIPTION OF THE PRIOR ART

In recent years, complementary metal oxide semiconductor (CMOS) circuits have become common in modern electronics. Such circuits are known for their low power requirements and high input impedance nature. Unfortunately, when such CMOS devices are employed in crystal controlled oscillator circuits, such oscillators tend to be high impedance in nature and thus very sensitive to parasitic effects. These parasitic effects are associated with either the conventional oscillator circuit itself, that is the manner of fabrication, or contamination associated with the oscillator printed circuit board. In such conventional CMOS crystal oscillator circuits, the parasitic impedance across the piezoelectric frequency control element must exhibit extremely high values, for example 10M ohms in order to obtain proper operation. Parasitic impedances as high as 2.5 M ohms have been known to cause oscillation to cease in some parallel resonant mode crystal controlled CMOS oscillators. Thus, in the past it was important that parasitic impedances be at least greater than 2.5 M ohms. Prior CMOS oscillators have been sensitive to variations in the parasitic impedance associated with the crystal frequency control elements thereof.

Accordingly, one object of the present invention is to provide a CMOS crystal controlled oscillator which will oscillate at a desired predetermined frequency despite a relatively large variation in the parasitic impedance exhibited across the crystal frequency control element therein.

Another object of the present invention is to provide a CMOS crystal controlled oscillator which is tolerant to variations in the parasitic impedance (capacitance) associated with the oscillator crystal control element.

These and other objects of the invention become apparent to those skilled in the art upon consideration of the following description of the invention.

BRIEF SUMMARY OF THE INVENTION

This invention is directed to providing a CMOS oscillator circuit which is tolerant to variations in both the parasitic impedance and parasitic capacitance associated with the frequency control element of such circuit.

In accordance with one embodiment of the invention, an oscillator circuit includes a complementary metal oxide semiconductor (MOS) transistor amplifier having an input and an output. Such amplifier includes a pair of first and second MOS transistors coupled together in a non-inverting configuration for amplifying signals provided thereto in a non-inverting manner. The oscillator circuit further includes an MOS transistor source follower having a high impedance input and a low impedance output. The input of the source follower is coupled to the output of the amplifier. A piezoelectric feedback device is coupled between the output of the source follower and the input of the amplifier. The piezoelectric feedback device provides feedback at a predetermined frequency from the source follower to the amplifier to cause the oscillator to oscillate at the aforementioned predetermined frequency. By configuring the oscillator circuit in this manner, the oscillator circuit is made to exhibit tolerance to variations in the impedance exhibited by the piezoelectric feedback device.

The features of the invention believed to be novel are set forth with particularity in the appended claims. The invention itself, however, both as to organization and method of operation, together with further objects and advantages thereof, may best be understood by reference to the following description taken in conjunction with the accompanying drawing.

DETAILED DESCRIPTION OF THE PREFERRED EMBODIMENT

Figure 1:
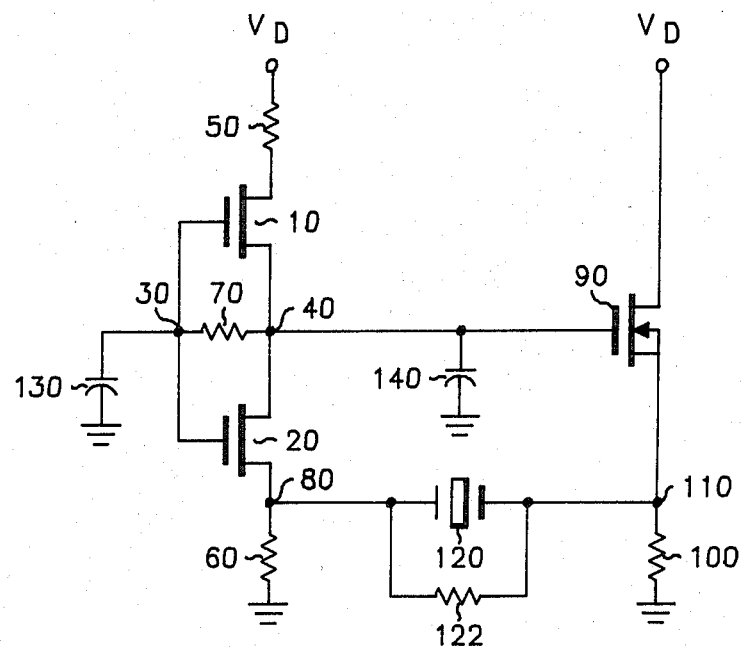
FIG. 1 is a schematic representation of one embodiment of the oscillator circuit of the present invention.

FIG. 1 illustrates one embodiment of the crystal controlled oscillator of the present invention wherein such oscillator includes MOS transistors 10 and 20 coupled together in complimentary fashion. Transistors 10 and 20 are P-channel and N-channel MOS transistors, respectively. The gates of transistors 10 and 20 are electrically coupled together to form a node 30. The drains of transistors 10 and 20 are electrically coupled together to form a node 40. A resistor 50 is coupled between the source of transistor 10 and a source of direct current power exhibiting a voltage $V_D$. In one embodiment of the invention, resistor 50 exhibits a resistance of 100 k ohms. The source of transistor 20 is coupled to ground via a resistor 60 which exhibits a resistance of 100 k ohms in one embodiment of the invention. A resistor 70 having a value of approximately 1M ohms is coupled between the coupled gates and coupled drains of transistors 10 and 20, that is, between nodes 30 and 40 as shown in FIG. 1. Resistor 70 cooperates with resistors 50 and 60 to provide direct current bias to transistors 10 and 20.

Node 80 is defined to be the node formed between the source of transistor 20 and resistor 60 coupled thereto. The circuit structure described above constitutes a non-inverting amplifier with node 80 as the input of the amplifier and node 40 as the output of the amplifier. That is, signals provided to node 80 are amplified by the amplifier formed by transistors 10 and 20. The amplified signals thus generated are provided to node 40.

The drains of transistors 10 and 20 and node 40 are coupled to the gate of an N-channel MOS transistor 90. Transistor 90 is configured to operate in a source follower mode. More specifically, the drain of transistor 90 is coupled to the source of direct current voltage $V_D$. The source of transistor 90 is coupled to ground via a resistor 100. In one embodiment of the invention, a typical value for resistor 100 is 100 k ohms. A node 110 is formed between the source of transistor 90 and resistor 100. The gate of transistor 90 operates as the input of the source follower formed by transistor 90 and resistor 100. Node 110 operates as the output of such source follower. This source follower operates to convert the high impedance exhibited at the input thereof to a relatively low impedance at the output thereof. This source follower typically exhibits a voltage gain somewhat less than one.

It is thus seen that signals provided to input node 80 are amplified by the non-inverting amplifier formed by transistors 10 and 20 and are provided output at node 40. Such amplified signals appearing at node 40 are coupled to the source follower amplifier at the gate of transistor 90 for impedance transformation by the source follower. Signals so transformed by transistor 90 appear at output node 110 of the source follower.

A feedback element 120 is coupled between output node 110 and input node 80. A piezoelectric crystal is employed as feedback element 120. Such crystal exhibits a resonant frequency at the frequency at which oscillation of the oscillator of FIG. 1 is desired. The parasitic impedance associated with piezoelectric crystal 120 is shown as a resistor 122 coupled in parallel with crystal 120. From the above, it is seen that a feedback loop exists, namely from the amplifier formed by transistors 10 and 20, through the source follower formed by transistor 90 and through piezoelectric crystal 120 back to the amplifier formed by transistors 10 and 20. It is noted that the stages formed by transistors 10 and 20 and the source follower formed by transistor 90 are both non-inverting. These amplifiers exhibit sufficient gain such that when feedback element 120 is coupled therebetween in the configuration shown in FIG. 1, oscillation occurs. In one embodiment of the invention, wherein the aforementioned component values are employed, oscillation occurs at a frequency $F_R$ of 32768 Hz when a 32768 Hz crystal 120 is employed. Of course oscillation at other frequencies may be obtained by selecting a different crystal resonant frequency and appropriately adjusting component values in the oscillator circuit.

In one embodiment of the invention, a capacitor 130 exhibiting a value of 22 pF, for example, is coupled between node 30 and ground as shown in FIG. 1. The combination of resistor 70 and capacitor 130 affects the low frequency roll off of the oscillator circuit. Also, in one embodiment of the invention, a capacitor 140 exhibiting a capacitance of 15 pF, for example, is coupled between node 40 and ground. Capacitor 140 affects the high frequency roll off of the oscillator of FIG. 1. Together, capacitors 130 and 140 determine the overall frequency response of the oscillator. Namely, capacitors 130 and 140 cause the oscillator of FIG. 1 to exhibit a bandpass type response having two poles.

Those skilled in the art will appreciate that current sources may be substituted for resistors 50, 60 and 100. In this instance current sources are equivalent to resistors 50, 60 and 100.

Figure 2:
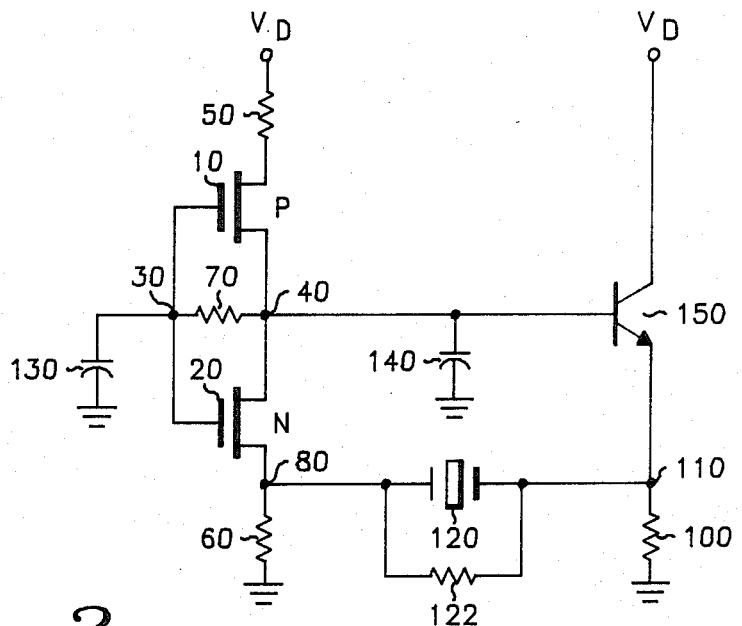
FIG. 2 is a schematic representation of another embodiment of the oscillator circuit of the present invention.

FIG. 2 is a schematic representation of another embodiment of the oscillator circuit of the present invention which is the same as the circuit of FIG. 1 except for the following modifications. Like numbers indicate like components. In place of CMOS transistor 90, the FIG. 2 oscillator circuit employs an NPN bipolar transistor 150. The collector of transistor 150 is coupled to the source of direct current electrical energy $V_D$. The emitter and base of transistor 150 are electrically coupled to node 110 and node 40, respectively.

The foregoing describes a crystal controlled two non-inverting stage CMOS oscillator circuit with low output impedance which is relatively insensitive to changes in the parasitic impedance associated with the crystal frequency control element of the oscillator. More specifically, the oscillator of FIG. 1 will continue to oscillate at a predetermined frequency determined by crystal 120 despite variations in the parasitic impedance of crystal 120 ranging from 100 M ohms to as little as 400 k ohms. Reliable operation of the oscillator is thus enhanced.

While only certain preferred features of the invention have been shown by way of illustration, many modifications and changes will occur to those skilled in the art. It is, therefore, to be understood that the present claims are intended to cover all such modifications and changes as fall within the true spirit of the invention.

What is claimed is:

1. An oscillator circuit comprising:

complementary MOS transistor amplifier means, having an input and an output and including first and second MOS transistors coupled together in a non-inverting complementary configuration, for amplifying signals provided thereto in a non-inverting manner;

MOS transistor source follower means, having a high impedance input and a low impedance output, the input of said source follower means being coupled to the output of said amplifier means, and piezoelectric feedback means, coupled between the output of said source follower means and the input of said amplifier means, for providing feedback at a predetermined frequency from said source follower means to said amplifier means to cause said oscillator to oscillate at said predetermined frequency, whereby, said oscillator circuit is made to exhibit tolerance to variation in the impedance exhibited across said piezoelectric feedback means.

2. An oscillator circuit comprising:

a first MOS transistor;

a second MOS transistor, the gates of said first and second MOS transistor being coupled together to form a first node, the drains of said first and second MOS transistors being coupled together to form a second node;

a third MOS transistor, the gate of which is coupled to said second node;

first resistance means coupling the source of said first MOS transistor to a source of electrical energy, the drain of said third MOS transistor being coupled to said source of electrical energy;

second resistance means coupled between said first and second node;

third resistance means coupled between the source of said second MOS transistor and ground;

fourth resistance means coupled between the source of said third MOS transistor and ground;

a piezoelectric crystal coupled between the source of said second MOS transistor and the source of said third MOS transistor for permitting feedback from said third MOS transistor to said second MOS transistor to cause said oscillator circuit to oscillate at a predetermined frequency $F_R$;

first capacitance means coupled from said first node to ground and second capacitance means coupled from said second node to ground, said first and second capacitance means being for determining the frequency FR at which said oscillator circuit oscillates.

3. An oscillator circuit comprising:

complementary MOS transistor amplifier means, having an input and an output and including first and second MOS transistors coupled together in a non-inverting complementary configuration, for amplifying signals provided thereto in a non-inverting manner;

bipolar transistor emitter follower means, having a high impedance input and a low impedance output, the input of said emitter follower means being coupled to the output of said amplifier means, and piezoelectric feedback means, coupled between the output of said emitter follower means and the input of said amplifier means, for providing feedback at a predetermined frequency from said emitter follower means to said amplifier means to cause said oscillator to oscillate at said predetermined frequency, whereby, said oscillator circuit is made to exhibit tolerance to variation in the impedance exhibited across said piezoelectric feedback means.

4. An oscillator circuit comprising:

a first MOS transistor;

a second MOS transistor, the gates of said first and second MOS transistor being coupled together to form a first node, the drains of said first and second MOS transistors being coupled together to form a second node;

a bipolar transistor, the base of which is coupled to said second node;

first resistance means coupling the source of said first MOS transistor to a source of electrical energy, the collector of said bipolar transistor being coupled to said source of electrical energy;

second resistance means coupled between said first and second node;

third resistance means coupled between the source of said second MOS transistor and ground;

fourth resistance means coupled between the emitter of said bipolar transistor and ground;

a piezoelectric crystal coupled between the source of said second MOS transistor and the emitter of said bipolar transistor for permitting feedback from said bipolar transistor to said second MOS transistor to cause said oscillator circuit to oscillate at a predetermined frequency $F_R$;

first capacitance means coupled from said first node to ground and second capacitance means coupled from said second node to ground, said first and second capacitance means being for determining the frequency $F_R$ at which said oscillator circuit oscillates.

* * * * *